April 4, 1961

E. K. VAN TASSEL

MULTIPLE OUTPUT DIODE DISTRIBUTOR AND AMPLIFICATION CIRCUITS 2,978,677

Filed Oct. 2, 1956

2 Sheets-Sheet 1

INVENTOR
E. K. VAN TASSEL
BY
Alan C. Rose
ATTORNEY

April 4, 1961

E. K. VAN TASSEL

MULTIPLE OUTPUT DIODE DISTRIBUTOR AND AMPLIFICATION CIRCUITS 2,978,677

Filed Oct. 2, 1956

2 Sheets-Sheet 2

INVENTOR
E. K. VAN TASSEL
BY
Alan C. Rose
ATTORNEY

United States Patent Office 2,978,677

Patented Apr. 4, 1961

2,978,677

MULTIPLE OUTPUT DIODE DISTRIBUTOR AND AMPLIFICATION CIRCUITS

Earl K. Van Tassel, Westfield, N.J., assignor to Bell Telephone Laboratories, Incorporated, New York, N.Y., a corporation of New York Filed Oct. 2, 1956, Ser. No. 613,526

4 Claims. (Cl. 340—167)

Figure 1:
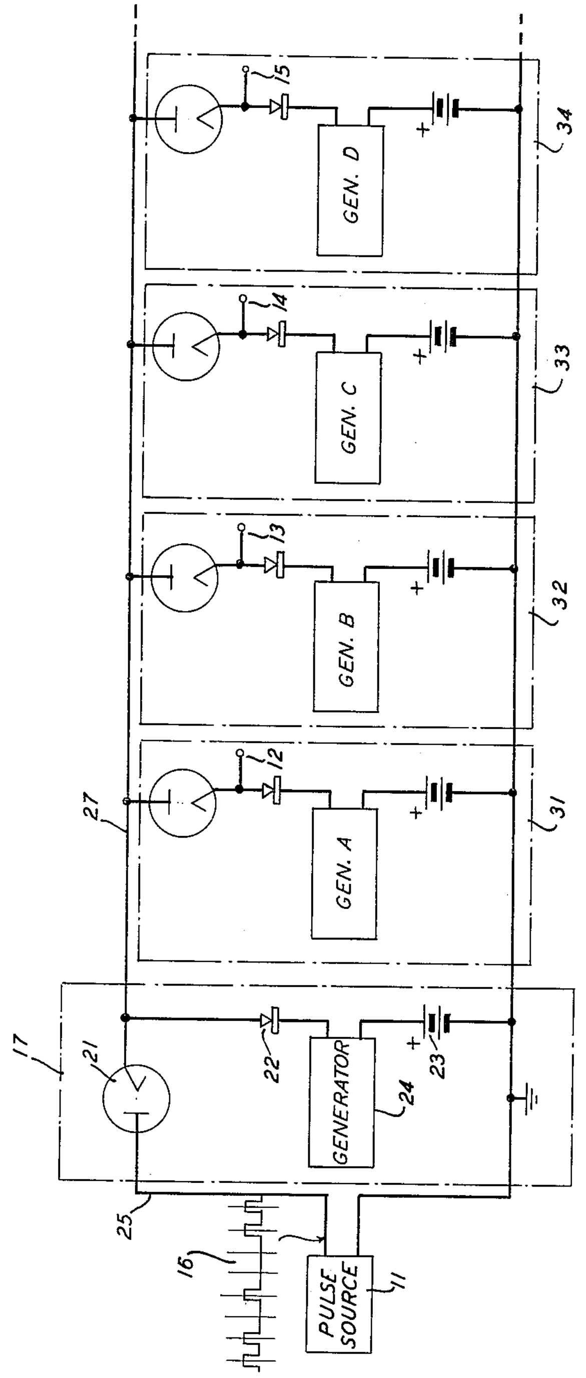

This invention relates to diode amplification circuits and more specifically to pulse amplification circuits for driving a plurality of output circuits from a single input circuit.

In data processing circuits in which information is transmitted in pulse form, a single input circuit must often drive several output circuits. Many pulse amplification circuits employing transistors or tubes have been proposed heretofore for this purpose. However, the amplification circuits of the prior art tend to be unnecessarily complex or bulky, or to require undesirably low operating frequencies. Furthermore, many of the pulse regenerators which are now in use can only drive three or four output circuits.

Accordingly, the principal object of the present invention is to provide a simple, high speed pulse amplification circuit for driving several output circuits from a single input circuit; and a collateral object is to increase the number of output circuits which may be driven from a pulse generator.

It is known that when the voltage applied to a normal semiconductor p-n junction diode is changed from the forward to the reverse current direction, a small amount of current flows in the reverse current direction. This effect is a result of the "diffusion" current component in diodes, and is supported by the presence of minority carriers in the semiconductor structure. In the circuits to be described in detail hereinafter in which diodes having different properties are employed, the term "slow diode" will indicate a diode in which magnitude and duration of the reverse current phenomenon noted above is appreciable, whereas the term "fast diode" will indicate a diode in which the effect is negligible.

In accordance with the present invention, it has been determined that a weak, brief input pulse applied to a "slow diode" in the forward direction is amplified and produces a powerful reverse pulse of much longer duration than the input pulse when polarity across the diode is reversed. By sampling this reverse pulse on a time division basis, a number of load circuits may be driven. An additional "fast diode" having negligible charge storage properties is connected in series with the first diode to avoid power dissipation in the input circuit.

In a preferred embodiment of the invention, the reverse pulse is sampled by additional diode amplification circuits which are driven by time-staggered pulse generation circuits. This arrangement permits the flow of current in the forward direction in diodes in each of the additional amplification circuits during successive portions of the reverse current pulse from the original diode amplifier. Upon the reversal of the voltage applied to the diodes in each of the additional amplification circuits, a substantial output pulse of appreciable duration is produced.

An important feature of the invention is the use of a plurality of diode amplification circuits connected in parallel to form a sampling circuit. Each amplifier includes a "fast diode" connected to the common input circuit and a "slow diode" connected in series with the "fast diode." Pulse generation circuitry controls the sampling of signals from the input circuit by the application of brief pulses to each pair of diodes in the low resistance direction. When the voltage applied to each pair of diodes is reversed, output signals are derived from a point between the diodes, and the "fast diode" isolates the reverse current output signals from the input circuit.

Figure 2:
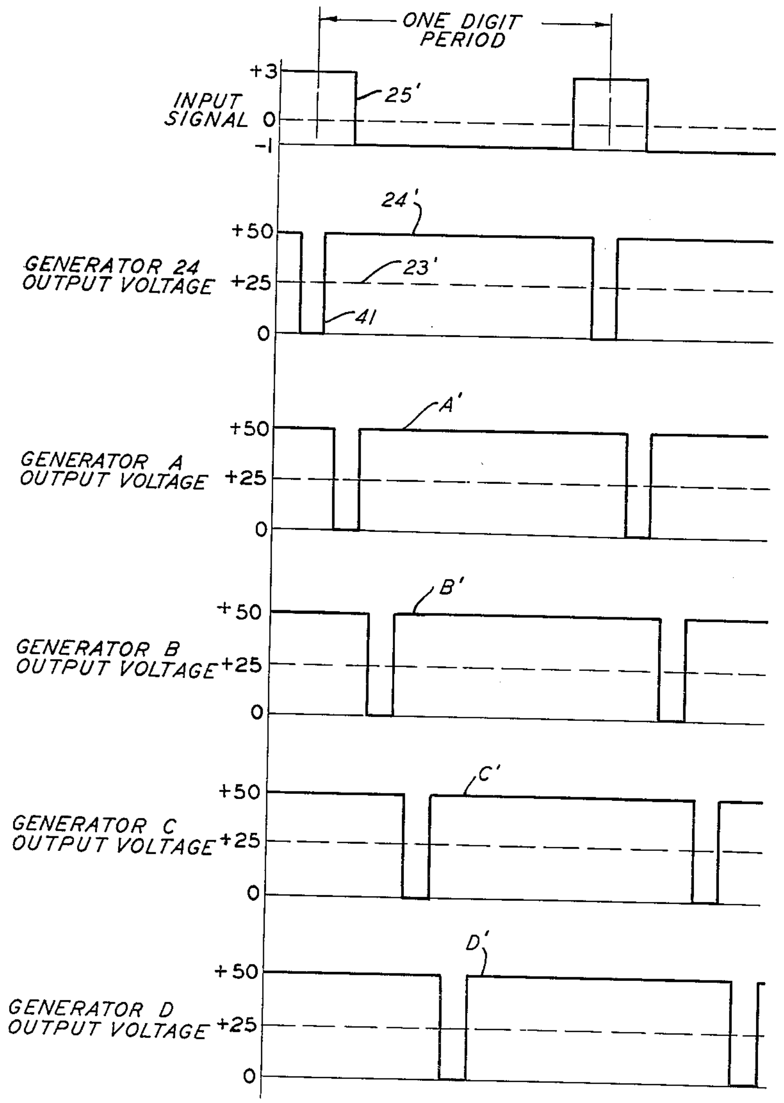

Other objects, and various features and advantages of the invention may be readily apprehended from the following detailed description and the accompanying drawing, in which:

Fig. 1 is a circuit diagram of a composite diode amplification circuit in accordance with the invention; and Fig. 2 is a diagram of the pulse forms which appear at various points in the circuit of Fig. 1.

With reference to the drawings, Fig. 1 shows, by way of example, a composite diode amplification circuit in which pulses from the source 11 are amplified and presented at the output circuits 12 through 15. The pulses from the source 11 may take the form indicated by the pulse train at 16. The pulse train 16 represents serial binary information in pulse form. The information is presented in terms of the presence or absence of pulses during successive digit periods. In the pulse train 16, successive digit periods are indicated by vertical lines. The pulse train 16 may, for example, represent an eight-digit code group. With the presence of a pulse representing the binary symbol "1" and the absence of a pulse indicating a "0," the pulse group 16 represents the binary code group 11010011.

The circuit within box 17 is a component diode amplifier which is known to those skilled in the art. However, because its mode of operation is important in understanding the present invention, the operation of the circuit 17 will now be considered in detail.

The amplification circuit 17 includes a fast diode 21 and a slow diode 22 connected in series. The diode 21 may, for example, be a vacuum tube diode, while diode 22 may be a conventional, commercially available, slow-speed junction diode. In addition, a biasing source 23 and a pulse generator 24 are provided. As shown in Fig. 2, the input pulses to the fast diode 21 are positive pulses rising from a base level which is slightly negative. The voltage source 23 is positive, and the output from the pulse generator 24 is combined with the biasing voltage in a transformer. The output voltage of the generator 24 is equal to that of the biasing voltage 23, and is reversed during each cycle of operation.

During a brief interval during each digit period, a negative-going enabling pulse from the generator 24 bucks the biasing voltage and reduces the voltage at the lower or cathode terminal of diode 22 to ground potential. If a positive pulse is present at the input lead 25 to the amplifier 17, conductive carriers are established in the slow diode 22 in the forward direction. When the voltage is reversed at the end of the negative pulse from the generator 24, however, these conductive carrier are swept out of the body of the diode 22. The period during which this sweeping out of conductive carriers occurs is termed the "reverse current surge period." This reverse current surge persists for a time period which may be many times as long as the pulse applied to diode 22 in the forward direction. In addition, the output pulse may be derived at a much higher voltage level than that of the original input pulse.

With the foregoing arrangement of the components of amplifier 17, an output pulse of substantial duration and magnitude appears on the reverse current output lead 27 during each digit period immediately following the application of pulses from the source 11 on lead 25 to the amplifier 17. The prolonged reverse current surge on lead 27 is sampled on a time division basis by the additional diode amplifiers 31 through 34. Each of the diode amplifiers 31 through 34 operates in the same manner as the amplifier 17 described above.

In Fig. 2, the wave forms which appear at various points in the circuit of Fig. 1 are set forth in some detail. Specifically, the wave form 25′ is that which appears at the output lead 25 from the pulse source 11. The wave form 24′ appears at the output of the clock pulse generator 24 which forms part of the amplifier 17, and the wave forms A′, B′, C′, and D′ appear at the outputs of the generators A through D in the amplification circuits 31 through 34, respectively. Referring to the plot 24′, it may be observed that it includes the brief negative-going enabling pulse 41. During the remaining portion of each cycle, however, the generator output is at a significant positive voltage, and therefore biases the diodes 21 and 22 in the reverse direction. The output pulse which appears on the reverse current output lead 27 in Fig. 1 following the occurrence of an input pulse 25′ corresponds roughly to the positive portion of plot 24′. However, the reverse current surge period of the diode 22 is slightly shorter than the duration of the positive portion of plot 24′, and the output pulse drops off to zero just before the next subsequent negative-going pulse from generator 24.

The plots A′, B′, C′, and D′ are similar to plot 24′, and the negative-going enabling pulses constitute relatively brief portions of each complete digit period in each case. In addition, it may be noted that the enabling pulses of the wave forms A′ through D′ are staggered in time so that the output portion of the wave form 24′ need only drive one of the amplifiers 31 through 34 at a time. Thus, the pairs of diodes are enabled successively, and the cycle of successive enabling pulses is repeated during each digit period.

Representative voltage levels are indicated on the wave form diagrams of Fig. 2. Specifically, it may be noted that the input pulses are relatively low in voltage level, and may, for example, rise to a level of plus three volts from a base of minus one volt. The voltage level indicated by the dashed line 23′ in Fig. 2 is that of the biasing voltage source 23. It may, for example, be equal to 25 volts. The output from the generator 24 is superposed on the biasing voltage, and has an amplitude equal to the biasing voltage. The resultant signal output from the generator 24 therefore ranges from plus 50 volts to a minimum of zero during the brief negative-going pulses. The output voltage wave forms associated with generators A through D are comparable to that of generator 24, as noted above. Accordingly, the output signals at each of the output terminals 12 through 15 are powerful pulses which last for the greater part of a digit period.

During digit periods when the pulse source 11 has no output pulse, there is, of course, no output pulse on the reverse current output lead 27, and no output pulses appear at terminals 12 through 15. Thus, the circuit of Fig. 1 constitutes a diode amplification circuit in which relatively weak signals from the pulse source 11 are amplified and applied at full strength and for a prolonged period to the output circuits 12 through 15.

In the foregoing description, the separate generators 24, and A through D have been disclosed. However, a tapped delay line energized by a single signal generator could be substituted for the indicated pulse generators. With this arrangement, the staggered wave forms 24′, and A′ through D′ would appear at the successive taps of the delay line.

Concerning the nature of the fast and slow diodes such as 21 and 22, respectively, in the amplifier 17 of Fig. 1, they may be realized in a number of ways. As mentioned above, the diode 21 may be a vacuum tube diode, and the diode 22 may be a conventional junction type semiconductor diode. Alternatively, the diode 21 may be a fast alloy junction diode, while a normal p-n junction diode is employed as the diode 22. The critical requirement is that the reverse current surge time of the diode 21 must be negligible with respect to a digit period, whereas the reverse current surge time of the diode 22 must be comparable in length with a digit period. By way of example, for frequencies of about 10 megacycles per second, a type 1N99 diode may be used for diode 21, while a type 1N138 diode may be used for the diode 22. Similarly, in the amplifiers 31 through 34, fast and slow diodes of the types indicated above may be employed.

In addition to the amplification properties mentioned above, the circuits of Fig. 1 also perform a pulse regeneration function. Furthermore, by the application of appropriate control voltages by the generators A through D, the output pulses at terminals 12 through 15 may be shaped to assume nearly any desired wave form pattern.

It may also be noted that the pulse amplifiers 31 through 34 constitute a sampling circuit. The signals appearing at consecutive time intervals on lead 27 are sampled by the application of negative enabling pulses from generators A through D. Thereafter, output signals corresponding to the samples appear at the output leads 12 through 15 for the duration of the reverse current surge period of the slow diodes associated with each amplifier. This sampling and short term storage function may, for example, be employed to convert serial binary information into parallel output information. To accomplish this function, however, input binary signals must be supplied to lead 27 at a pulse repetition rate equal to the rate at which successive enabling pulses appear at the outputs of generators A through D.

It is to be understood that the above-described arrangements are illustrative of the application of the principles of the invention. Numerous other arrangements may be devised by those skilled in the art without departing from the spirit and scope of the invention.

What is claimed is:

1. In a circuit for processing serial binary pulse signals in which the binary information is presented at digit period intervals, a source of binary pulse signals, a fast diode and a slow diode connected in a first series circuit to receive pulse from said source of pulses in the forward direction, the reverse current surge time of said fast diode being negligible with respect to a digit period and the reverse current surge time of said slow diode being comparable to a digit period, a reverse current output circuit connected to said first series circuit between said diodes, a plurality of additional series connected pairs of fast and slow diodes connected in parallel to said reverse current output circuit to receive pulses from said first series circuit in the forward direction, biasing means for normally biasing all of said pairs of diodes in the reverse current direction, a plurality of pulse output circuits connected between the two diodes of each of said additional series connected pairs of diodes, and means for successively applying pulses to all of said respective pairs of diodes in the forward direction during each digit period, whereby each of said pulse output circuits is energized during digit periods when a pulse is received from said source.

2. In combination, a source of pulse signals having a predetermined periodicity, a fast diode and a slow diode connected in a first series circuit to receive pulses from said source of pulses in the forward direction, the reverse current surge time of said fast diode being negligible with respect to the period between pulses from said source and the reverse current surge time of said slow diode being comparable to said period, a reverse current output circuit connected to said first series circuit between said fast and slow diodes, a plurality of additional series connected pairs of fast and slow diodes connected in parallel to said reverse current output circuit to receive pulses from said first series circuit in the forward direction, biasing means for normally biasing all of said pairs of diodes in the reverse current direction, a plurality of pulse output circuits connected respectively between the fast and slow diodes of each of said additional series connected pairs of diodes, and means for successively applying pulses to all of said respective pairs of diodes in the forward direction during each pulse period, whereby each of said pulse output circuits is energized when a pulse is received from said source of pulse signals.

3. In combination, a source of pulse signals having a predetermined periodicity, a fast diode and a slow diode connected in a first series circuit to receive pulses from said source of pulses in the forward direction, the reverse current surge time of said fast diode being negligible with respect to the period between pulses from said source and the reverse current surge time of said slow diode being comparable to said period, a reverse current output circuit connected to said first series circuit between said fast and slow diodes, an additional series connected pair of fast and slow diodes connected to said reverse current output circuit to receive pulses from said first series circuit in the forward direction, biasing means for normally biasing both of said pairs of diodes in the reverse current direction, a pulse output circuit connected between the fast and slow diodes of said additional series connected pair of diodes, and means for successively applying signal voltages to said pairs of diodes in the forward direction during each pulse period.

4. A sampling circuit comprising an input pulse circuit, a plurality of diode amplification circuits coupled in parallel to said input circuit, each of said amplification circuits including a fast diode and a slow diode connected in series, a plurality of sample output circuits connected respectively between the fast and slow diodes of each of said series connected pairs of diodes, biasing means for normally biasing all of said pairs of fast and slow diodes in the reverse current direction, means for successively and cyclically applying enabling pulses to all of said respective pairs of diodes in the forward direction during the period of a pulse from said input circuit, each of said fast diodes having a reverse current surge time which is negligible with respect to the length of one of said enabling pulses, and each of said slow diodes having a reverse current surge time comparable to the time required for the application of a cycle of enabling pulses to said pairs of diodes.

References Cited in the file of this patent

UNITED STATES PATENTS

| | | |
|---|---|---|
| 2,471,253 | Toulon | May 24, 1949 |
| 2,592,308 | Meacham | Apr. 8, 1952 |
| 2,823,321 | Sims | Feb. 11, 1958 |

FOREIGN PATENTS

| | | |
|---|---|---|
| 166,800 | Australia | Feb. 6, 1956 |

OTHER REFERENCES

"Now—Diodes Amplify!", Radio-Electronics, Nov. 1954, vol. XXV, No. 11, pp. 94–95.